US012635065B2

(12) United States Patent
Igarashi et al.

(10) Patent No.: US 12,635,065 B2
(45) Date of Patent: May 19, 2026

(54) PRINTED WIRING BOARD

(71) Applicants:SUMITOMO ELECTRIC INDUSTRIES, LTD., Osaka (JP); SUMITOMO ELECTRIC PRINTED CIRCUITS, INC., Shiga (JP)

(72) Inventors: Shun Igarashi, Osaka (JP); Ichiro Kuwayama, Osaka (JP); Suguru Yamagishi, Osaka (JP); Hiroshi Ueda, Osaka (JP); Satoshi Kiya, Shiga (JP)

(73) Assignees: Sumitomo Electric Industries, Ltd., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 119 days.

(21) Appl. No.: 18/711,599

(22) PCT Filed: Nov. 22, 2022

(86) PCT No.: PCT/JP2022/043215
§ 371 (c)(1),
(2) Date: May 19, 2024

(87) PCT Pub. No.: WO2023/095798
PCT Pub. Date: Jun. 1, 2023

(65) Prior Publication Data
US 2025/0031299 A1     Jan. 23, 2025

(30) Foreign Application Priority Data
Nov. 24, 2021     (JP) ................................. 2021-190207

(51) Int. Cl.
H05K 1/02        (2006.01)
H05K 1/11        (2006.01)

(52) U.S. Cl.
CPC ........... H05K 1/0228 (2013.01); H05K 1/115 (2013.01); *H05K 2201/09236* (2013.01); *H05K 2201/09618* (2013.01); *H05K 2201/09636* (2013.01)

(58) Field of Classification Search
CPC .................................................... H05K 1/0228
(Continued)

(56) References Cited

U.S. PATENT DOCUMENTS 9,282,634 B2 * 3/2016 Ohira ................... H05K 1/0207
10,932,356 B2 * 2/2021 Nozawa ............... H05K 9/0026
(Continued)

FOREIGN PATENT DOCUMENTS

JP        2006-024618 A        1/2006
JP        2010-212439 A        9/2010
(Continued)

OTHER PUBLICATIONS

Non-Final Office Action received for U.S. Appl. No. 18/711,596, mailed on Jan. 28, 2026, 18 pages.

*Primary Examiner* — Stanley Tso
(74) *Attorney, Agent, or Firm* — Renner, Otto, Boisselle & Sklar, LLP

(57)        ABSTRACT

A printed wiring board includes: a first insulating layer having a first main surface and a second main surface opposite to the first main surface; a first wire pattern, a second wire pattern, and a first ground pattern that are disposed on the second main surface and extend along a first direction in a plan view; a second ground pattern disposed on the first main surface; an adhesive layer disposed on the second main surface so as to cover the first wire pattern, the second wire pattern, and the first ground pattern; a second insulating layer disposed on the adhesive layer and having a third main surface facing the adhesive layer and a fourth
(Continued)

<u>100</u> main surface opposite to the third main surface; a third ground pattern disposed on the fourth main surface; and a first conductor layer and a second conductor layer.

11 Claims, 26 Drawing Sheets

(58) Field of Classification Search
USPC .......................................................... 174/261
See application file for complete search history.

(56) References Cited

U.S. PATENT DOCUMENTS

| | | | | |
|---|---|---|---|---|
| 2005/0230813 A1* | 10/2005 | Nakamura | ........... | H05K 1/0222 |
| | | | | 257/774 |
| 2023/0019563 A1* | 1/2023 | Nitta | ...................... | H01P 3/088 |

FOREIGN PATENT DOCUMENTS

| | | | |
|---|---|---|---|
| JP | 2018-200982 A1 | 12/2018 |
| WO | 2021/230215 A1 | 11/2021 |

* cited by examiner

PRINTED WIRING BOARD

TECHNICAL FIELD

The present disclosure relates to a printed wiring board. The present application claims the priority based on Japanese Patent Application No. 2021-190207 filed on Nov. 24, 2021. The entire contents of the description in this Japanese patent application are incorporated herein by reference.

BACKGROUND ART

Japanese Patent Laying-Open No. 2006-24618 (PTL 1) describes a wiring board. The wiring board described in PTL 1 has a first dielectric layer, a first wire pattern, a second wire pattern and a coplanar ground pattern, a second dielectric layer, a first ground pattern and a second ground pattern, and a conductor layer.

The first dielectric layer has a first main surface and a second main surface opposite to the first main surface. The first wire pattern, the second wire pattern and the coplanar ground pattern are disposed on the second main surface. The first wire pattern, the second wire pattern and the coplanar ground pattern extend along a first direction. The coplanar ground pattern is disposed between the first wire pattern and the second wire pattern in a second direction orthogonal to the first direction.

The second dielectric layer is disposed on the second main surface so as to cover the first wire pattern, the second wire pattern and the coplanar ground pattern. The second dielectric layer has a third main surface facing the second main surface side, and a fourth main surface opposite to the third main surface. The first ground pattern and the second ground pattern are disposed on the first main surface and on the fourth main surface, respectively.

A plurality of through-holes are formed in the wiring board described in PTL 1. The plurality of through-holes are arranged along the first direction in a plan view. The through-holes pass through the first dielectric layer, the second dielectric layer and the coplanar ground pattern. Each of the through-holes has a circular shape in a plan view. Each of the through-holes is filled with the conductor layer. The coplanar ground pattern is electrically connected to the first ground pattern and the second ground pattern by the conductor layer. In the wiring board described in PTL 1, crosstalk between the first wire pattern and the second wire pattern is suppressed by the conductor layer.

CITATION LIST

Patent Literature

PTL 1: Japanese Patent Laying-Open No. 2006-24618

SUMMARY OF INVENTION

A printed wiring board of the present disclosure includes: a first insulating layer having a first main surface and a second main surface opposite to the first main surface; a first wire pattern, a second wire pattern, and a first ground pattern that are disposed on the second main surface and extend along a first direction in a plan view; a second ground pattern disposed on the first main surface; an adhesive layer disposed on the second main surface so as to cover the first wire pattern, the second wire pattern, and the first ground pattern; a second insulating layer disposed on the adhesive layer and having a third main surface facing the adhesive layer and a fourth main surface opposite to the third main surface; a third ground pattern disposed on the fourth main surface; and a first conductor layer and a second conductor layer. In a second direction orthogonal to the first direction, the first ground pattern is located between the first wire pattern and the second wire pattern, and spaced apart from the first wire pattern and the second wire pattern. In the first insulating layer and the second ground pattern, a plurality of first through-holes passing through the first insulating layer and the second ground pattern in a thickness direction orthogonal to the first direction and the second direction, and overlapping the first ground pattern in a plan view are formed. The plurality of first through-holes are spaced apart from each other and arranged to line up along the first direction. In the adhesive layer, the second insulating layer, and the third ground pattern, a plurality of second through-holes passing through the adhesive layer, the second insulating layer, and the third ground pattern in the thickness direction, and overlapping the first ground pattern in a plan view are formed. The plurality of second through-holes are spaced apart from each other and arranged to line up along the first direction. The first conductor layer is disposed on an inner wall surface of each of the plurality of first through-holes, and electrically connected to the first ground pattern and the second ground pattern. The second conductor layer is disposed on an inner wall surface of each of the plurality of second through-holes, and electrically connected to the first ground pattern and the third ground pattern. Each of the plurality of first through-holes and each of the plurality of second through-holes have a width in the first direction and a width in the second direction, and the width in the first direction is larger than the width in the second direction.

DETAILED DESCRIPTION

Figure 1:
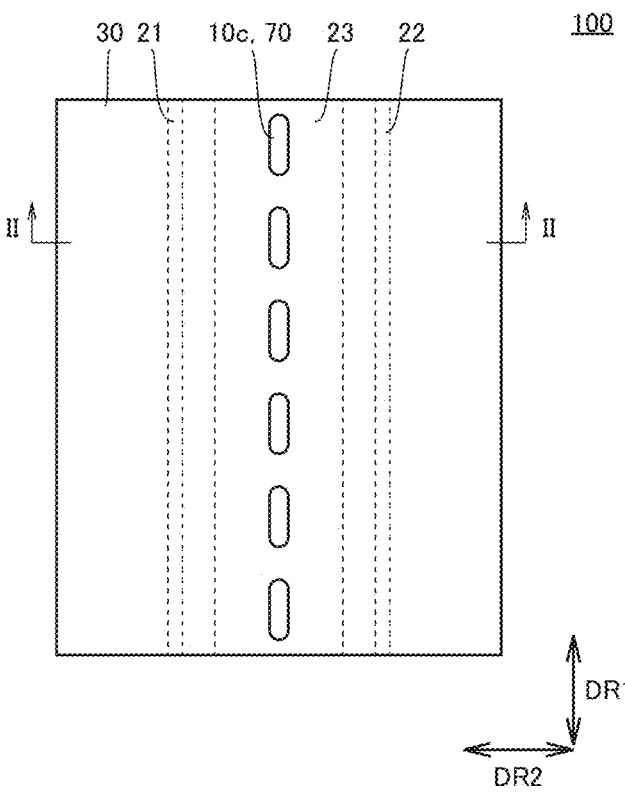
FIG. 1 is a plan view of a printed wiring board 100.

Problem to be Solved by the Present Disclosure

However, in the wiring board described in PTL 1, crosstalk between the first wire pattern and the second wire pattern is not sufficiently suppressed.

The present disclosure has been made in view of the problem of the conventional technique as described above. More specifically, the present disclosure provides a printed wiring board in which crosstalk between a first wire pattern and a second wire pattern can be suppressed.

Advantageous Effect of the Present Disclosure

According to the printed wiring board of the present disclosure, crosstalk between the first wire pattern and the second wire pattern can be suppressed.

Description of Embodiments of the Present Disclosure

First, embodiments of the present disclosure will be listed and described.

(1) A printed wiring board according to an embodiment includes: a first insulating layer having a first main surface and a second main surface opposite to the first main surface; a first wire pattern, a second wire pattern, and a first ground pattern that are disposed on the second main surface and extend along a first direction in a plan view; a second ground pattern disposed on the first main surface; an adhesive layer disposed on the second main surface so as to cover the first wire pattern, the second wire pattern, and the first ground pattern; a second insulating layer disposed on the adhesive layer and having a third main surface facing the adhesive layer and a fourth main surface opposite to the third main surface; a third ground pattern disposed on the fourth main surface; and a first conductor layer and a second conductor layer. In a second direction orthogonal to the first direction, the first ground pattern is located between the first wire pattern and the second wire pattern, and spaced apart from the first wire pattern and the second wire pattern. In the first insulating layer and the second ground pattern, a plurality of first through-holes passing through the first insulating layer and the second ground pattern in a thickness direction orthogonal to the first direction and the second direction, and overlapping the first ground pattern in a plan view are formed. The plurality of first through-holes are spaced apart from each other and arranged to line up along the first direction. In the adhesive layer, the second insulating layer, and the third ground pattern, a plurality of second through-holes passing through the adhesive layer, the second insulating layer, and the third ground pattern in the thickness direction, and overlapping the first ground pattern in a plan view are formed. The plurality of second through-holes are spaced apart from each other and arranged to line up along the first direction. The first conductor layer is disposed on an inner wall surface of each of the plurality of first through-holes, and electrically connected to the first ground pattern and the second ground pattern. The second conductor layer is disposed on an inner wall surface of each of the plurality of second through-holes, and electrically connected to the first ground pattern and the third ground pattern. Each of the plurality of first through-holes and each of the plurality of second through-holes have a width in the first direction and a width in the second direction, and the width in the first direction is larger than the width in the second direction.

According to the printed wiring board of (1) above, crosstalk between the first wire pattern and the second wire pattern can be suppressed.

(2) In the printed wiring board of (1) above, each of the plurality of first through-holes and each of the plurality of second through-holes may extend along the first direction in a plan view.

(3) In the printed wiring board of (1) above, in the first insulating layer and the second ground pattern, a plurality of third through-holes passing through the first insulating layer and the second ground pattern in the thickness direction and overlapping the first ground pattern in a plan view may further be formed. The plurality of third through-holes may be spaced apart from each other and arranged to line up along the first direction, between a line of the plurality of first through-holes and the second wire pattern. In the adhesive layer, the second insulating layer, and the third ground pattern, a plurality of fourth through-holes passing through the adhesive layer, the second insulating layer, and the third ground pattern in the thickness direction and overlapping the first ground pattern in a plan view may further be formed. The plurality of fourth through-holes may be spaced apart from each other and arranged to line up along the first direction, between a line of the plurality of second through-holes and the second wire pattern. A position of each of the plurality of third through-holes in the first direction may be displaced from a position of each of the plurality of first through-holes in the first direction. A position of each of the plurality of fourth through-holes in the first direction may be displaced from a position of each of the plurality of second through-holes in the first direction. The first conductor layer may further be disposed on an inner wall surface of each of the plurality of third through-holes, and electrically connected to the first ground pattern and the second ground pattern. The second conductor layer may further be disposed on an inner wall surface of each of the plurality of fourth through-holes, and electrically connected to the first ground pattern and the third ground pattern. Each of the plurality of third through-holes and each of the plurality of fourth through-holes may have a width in the first direction and a width in the second direction, and the width in the first direction may be larger than the width in the second direction.

According to the printed wiring board of (3) above, crosstalk between the first wire pattern and the second wire pattern can further be suppressed.

(4) In the printed wiring board of (3) above, each of the plurality of first through-holes, each of the plurality of second through-holes, each of the plurality of third through-holes, and each of the plurality of fourth through-holes may extend along the first direction in a plan view.

(5) In the printed wiring board of (3) above, each of the plurality of first through-holes, each of the plurality of second through-holes, each of the plurality of third through-holes, and each of the plurality of fourth through-holes may include a first portion extending along the first direction and a second portion connected to a central portion of the first portion in the first direction, in a plan view. In each of the plurality of first through-holes and each of the plurality of second through-holes, the second portion may extend from the first portion along a direction from the first wire pattern toward the second wire pattern. In each of the plurality of third through-holes and each of the plurality of fourth through-holes, the second portion may extend from the first portion along a direction from the second wire pattern toward the first wire pattern.

According to the printed wiring board of (5) above, crosstalk between the first wire pattern and the second wire pattern can further be suppressed.

(6) In the printed wiring board of (3) above, each of the plurality of first through-holes, each of the plurality of second through-holes, each of the plurality of third through-holes, and each of the plurality of fourth through-holes may include a third portion and a fourth portion each extending linearly in a plan view. One end of the third portion and one end of the fourth portion may be connected to each other. The one end of the third portion may be located on one side in the first direction, relative to the other end of the third portion. The one end of the fourth portion may be located on the other side in the first direction, relative to the other end of the fourth portion. In each of the plurality of first through-holes and each of the plurality of second through-holes, the other end of the third portion and the other end of the fourth portion may be located closer to the second wire pattern, relative to the one end of the third portion and the one end of the fourth portion, respectively. In each of the plurality of third through-holes and each of the plurality of fourth through-holes, the other end of the third portion and the other end of the fourth portion may be located closer to the first wire pattern, relative to the one end of the third portion and the one end of the fourth portion, respectively.

According to the printed wiring board of (6) above, crosstalk between the first wire pattern and the second wire pattern can further be suppressed.

(7) In the printed wiring board of (1) above, each of the plurality of first through-holes and each of the plurality of second through-holes may extend along the first direction in a plan view. A position of each of the plurality of first through-holes in the second direction may overlap a position of each of the plurality of second through-holes in the second direction. Each of the plurality of first through-holes may be located between two second through-holes adjacent to each other in the first direction, among the plurality of second through-holes.

According to the printed wiring board of (7) above, damage to the first ground pattern exposed from the first through-holes and the first ground pattern exposed from the second through-holes can be suppressed.

(8) In the printed wiring board of (7) above, in the first insulating layer and the second ground pattern, a plurality of third through-holes passing through the first insulating layer and the second ground pattern in the thickness direction and overlapping the first ground pattern in a plan view may further be formed. The plurality of third through-holes may be spaced apart from each other and arranged to line up along the first direction, between a line of the plurality of first through-holes and the second wire pattern. In the adhesive layer, the second insulating layer, and the third ground pattern, a plurality of fourth through-holes passing through the adhesive layer, the second insulating layer, and the third ground pattern in the thickness direction and overlapping the first ground pattern in a plan view may further be formed. The plurality of fourth through-holes may be spaced apart from each other and arranged to line up along the first direction, between a line of the plurality of second through-holes and the second wire pattern. Each of the plurality of third through-holes and each of the plurality of fourth through-holes may extend along the first direction in a plan view. A position of each of the plurality of third through-holes in the second direction may overlap a position of each of the plurality of fourth through-holes in the second direction. Each of the plurality of third through-holes may be located between two fourth through-holes adjacent to each other in the first direction, among the plurality of fourth through-holes. The first conductor layer may further be disposed on an inner wall surface of each of the plurality of third through-holes, and electrically connected to the first ground pattern and the second ground pattern. The second conductor layer may further be disposed on an inner wall surface of each of the plurality of fourth through-holes, and electrically connected to the first ground pattern and the third ground pattern.

According to the printed wiring board of (8) above, damage to the first ground pattern exposed from the first through-holes, the first ground pattern exposed from the second through-holes, the first ground pattern exposed from the third through-holes, and the first ground pattern exposed from the fourth through-holes, can be suppressed.

(9) In the printed wiring board of (8) above, a position of each of the plurality of third through-holes in the first direction may be displaced from a position of each of the plurality of first through-holes in the first direction. A position of each of the plurality of fourth through-holes in the first direction may be displaced from a position of each of the plurality of second through-holes in the first direction.

According to the printed wiring board of (9) above, crosstalk between the first wire pattern and the second wire pattern can further be suppressed.

(10) In the printed wiring board of (1) above, each of the plurality of first through-holes and each of the plurality of second through-holes may extend along the first direction in a plan view. Respective positions of the plurality of first through-holes may overlap respective positions of the plurality of second through-holes, respectively, in the first direction and the second direction. A length of each of the plurality of first through-holes in the first direction may be larger than a length of each of the plurality of second through-holes in the first direction.

According to the printed wiring board of (10) above, damage to the first ground pattern exposed from the first through-holes and the second through-holes can be suppressed.

(11) In the printed wiring board of (10) above, in the first insulating layer and the second ground pattern, a plurality of third through-holes passing through the first insulating layer and the second ground pattern in the thickness direction and overlapping the first ground pattern in a plan view may further be formed. The plurality of third through-holes may be spaced apart from each other and arranged to line up along the first direction, between a line of the plurality of first through-holes and the second wire pattern. In the adhesive layer, the second insulating layer, and the third ground pattern, a plurality of fourth through-holes passing through the adhesive layer, the second insulating layer, and the third ground pattern in the thickness direction and overlapping the first ground pattern in a plan view may further be formed. The plurality of fourth through-holes may be spaced apart from each other and arranged to line up along the first direction, between a line of the plurality of second through-holes and the second wire pattern. Each of the plurality of third through-holes and each of the plurality of fourth through-holes may extend along the first direction in a plan view. Respective positions of the plurality of third through-holes may overlap respective positions of the plurality of fourth through-holes, respectively, in the first direction and the second direction. A length of each of the plurality of fourth through-holes in the first direction may be larger than a length of each of the plurality of third through-holes in the first direction. The first conductor layer may further be disposed on an inner wall surface of each of the plurality of third through-holes, and electrically connected to the first ground pattern and the second ground pattern. The second conductor layer may further be disposed on an inner wall surface of each of the plurality of fourth through-holes, and electrically connected to the first ground pattern and the third ground pattern.

According to the printed wiring board of (11) above, damage to the first ground pattern exposed from the first through-holes and the second through-holes as well as the first ground pattern exposed from the third through-holes and the fourth through-holes can be suppressed.

Details of Embodiments of the Present Disclosure

Details of embodiments of the present disclosure will be described with reference to the drawings. In the drawings below, the same or corresponding parts are denoted by the same reference characters and redundant description will not be repeated.

First Embodiment

A printed wiring board according to a first embodiment will be described. The printed wiring board according to the first embodiment will be referred to as a printed wiring board 100.

<Configuration of Printed Wiring Board 100>

A configuration of printed wiring board 100 will be described below.

Figure 2:
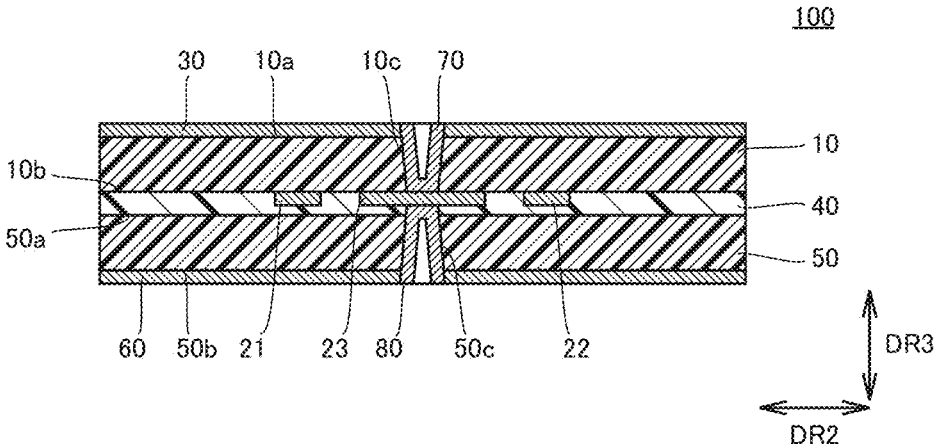
FIG. 2 is a cross-sectional view taken along II-II in FIG. 1.

FIG. 1 is a plan view of printed wiring board 100. FIG. 2 is a cross-sectional view taken along II-II in FIG. 1. As shown in FIGS. 1 and 2, printed wiring board 100 includes: a first insulating layer 10; a first wire pattern 21, a second wire pattern 22 and a first ground pattern 23; a second ground pattern 30; an adhesive layer 40; a second insulating layer 50; a third ground pattern 60; and a first conductor layer 70 and a second conductor layer 80.

First insulating layer 10 is made of an electrically insulating material. First insulating layer 10 is made of, for example, polyimide, fluororesin or the like. First insulating layer 10 has a first main surface 10a and a second main surface 10b. First main surface 10a and second main surface 10b are end faces of first insulating layer 10 in a thickness direction. Second main surface 10b is a surface opposite to first main surface 10a.

First wire pattern 21, second wire pattern 22 and first ground pattern 23 are disposed on second main surface 10b. Each of first wire pattern 21, second wire pattern 22 and first ground pattern 23 is made of an electrically conductive material. Each of first wire pattern 21, second wire pattern 22 and first ground pattern 23 is made of, for example, copper.

First wire pattern 21, second wire pattern 22 and first ground pattern 23 extend along a first direction DR1 in a plan view. In a second direction DR2, first ground pattern 23 is located between first wire pattern 21 and second wire pattern 22, and spaced apart from first wire pattern 21 and second wire pattern 22. Second direction DR2 is a direction orthogonal to first direction DR1.

A width of first ground pattern 23 in second direction DR2 is preferably larger than a width of first wire pattern 21 in second direction DR2 and a width of second wire pattern 22 in second direction DR2.

Second ground pattern 30 is made of an electrically conductive material. Second ground pattern 30 is made of, for example, copper. Second ground pattern 30 is disposed on first main surface 10a.

Second ground pattern 30 overlaps first wire pattern 21, second wire pattern 22 and first ground pattern 23 in a plan view. Second ground pattern 30 preferably covers entire first main surface 10a.

Adhesive layer 40 is made of, for example, a thermosetting resin material such as an epoxy resin. Adhesive layer 40 is disposed on second main surface 10b so as to cover first wire pattern 21, second wire pattern 22 and first ground pattern 23.

Second insulating layer 50 is made of an electrically insulating material. Second insulating layer 50 is made of, for example, polyimide, fluororesin or the like. It is preferable that second insulating layer 50 should be made of the same material as that of first insulating layer 10. Second insulating layer 50 has a third main surface 50a and a fourth main surface 50b. Third main surface 50a and fourth main surface 50b are end faces of second insulating layer 50 in the thickness direction. Third main surface 50a faces the adhesive layer 40 side. Fourth main surface 50b is a surface opposite to third main surface 50a.

Third ground pattern 60 is made of an electrically conductive material. Third ground pattern 60 is made of, for example, copper. Third ground pattern 60 is disposed on fourth main surface 50b.

Third ground pattern 60 overlaps first wire pattern 21, second wire pattern 22 and first ground pattern 23 in a plan view. Third ground pattern 60 preferably covers entire fourth main surface 50b.

A plurality of first through-holes 10c are formed in first insulating layer 10 and second ground pattern 30. First through-holes 10c pass through first insulating layer 10 and second ground pattern 30 in a thickness direction DR3. Thickness direction DR3 is a direction orthogonal to first direction DR1 and second direction DR2.

The plurality of first through-holes 10c are spaced apart from each other and arranged to line up along first direction DR1 in a plan view. An interval between first through-holes 10c adjacent to each other in first direction DR1 is constant, for example. First through-holes 10c overlap first ground pattern 23 in a plan view. Namely, first ground pattern 23 is exposed from first through-holes 10c.

The width of first through-hole 10c in first direction DR1 is larger than the width of first through-hole 10c in second direction DR2. First through-hole 10c extends along first direction DR1, for example. First through-hole 10c preferably has such an elliptical shape that a longitudinal direction is along first direction DR1 in a plan view.

A plurality of second through-holes 50c are formed in adhesive layer 40, second insulating layer 50, and third ground pattern 60. Second through-holes 50c pass through adhesive layer 40, second insulating layer 50, and third ground pattern 60 in thickness direction DR3.

The plurality of second through-holes 50c are spaced apart from each other and arranged to line up along first direction DR1 in a plan view. An interval between second through-holes 50c adjacent to each other in first direction DR1 is constant, for example. Second through-holes 50c overlap first ground pattern 23 in a plan view. Namely first ground pattern 23 is exposed from second through-holes 50c.

The width of second through-hole 50c in first direction DR1 is larger than the width of second through-hole 50c in second direction DR2. Second through-hole 50c extends along first direction DR1, for example. Second through-hole 50c preferably has such an elliptical shape that a longitudinal direction is along first direction DR1 in a plan view.

The width of first through-hole 10c in first direction DR1 is equal to the width of second through-hole 50c in first direction DR1, and the width of first through-hole 10c in second direction DR2 is equal to the width of second through-hole 50c in second direction DR2. The position of first through-hole 10c in first direction DR1 and the position of first through-hole 10c in second direction DR2 overlap the position of second through-hole 50c in first direction DR1 and the position of second through-hole 50c in second direction DR2, respectively.

First conductor layer 70 is a layer formed by plating, for example. First conductor layer 70 is made of, for example, copper. First conductor layer 70 is disposed on an inner wall surface of each of first through-holes 10c. First conductor layer 70 may also be disposed on first ground pattern 23 exposed from first through-holes 10c. First ground pattern 23 exposed from first through-holes 10c is electrically connected to second ground pattern 30 by first conductor layer 70.

Second conductor layer 80 is a layer formed by plating, for example. Second conductor layer 80 is made of, for example, copper. Second conductor layer 80 is disposed on an inner wall surface of each of second through-holes 50c. Second conductor layer 80 may also be disposed on first ground pattern 23 exposed from second through-holes 50c. First ground pattern 23 exposed from second through-holes 50c is electrically connected to third ground pattern 60 by second conductor layer 80.

<Method for Manufacturing Printed Wiring Board 100>

A method for manufacturing printed wiring board 100 will be described below.

Figure 3:
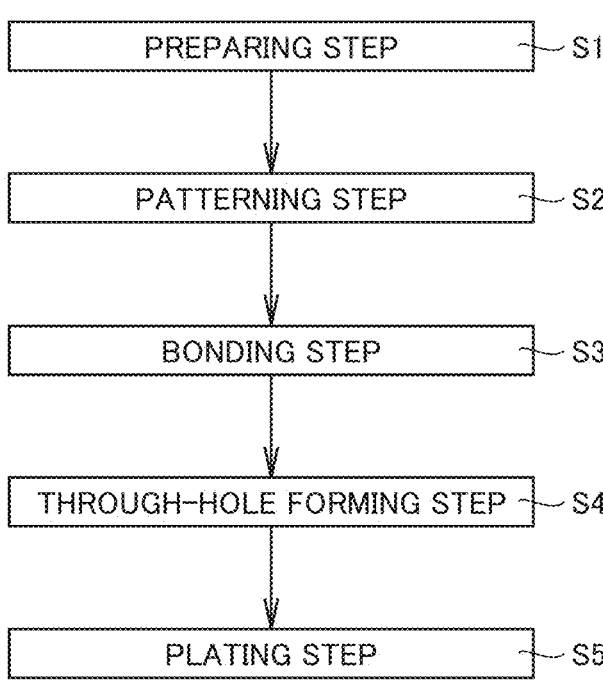
FIG. 3 is a process diagram showing a method for manufacturing printed wiring board 100.

FIG. 3 is a process diagram showing the method for manufacturing printed wiring board 100. As shown in FIG. 3, the method for manufacturing printed wiring board 100 has a preparing step S1, a patterning step S2, a bonding step S3, a through-hole forming step S4, and a plating step S5.

Figure 4:
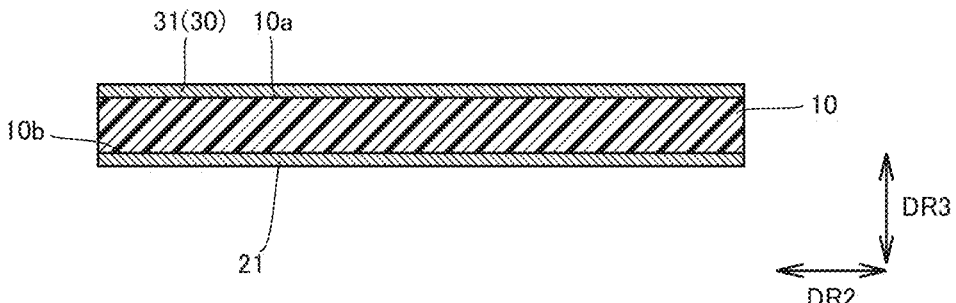
FIG. 4 is a cross-sectional view illustrating a preparing step S1.

FIG. 4 is a cross-sectional view illustrating preparing step S1. As shown in FIG. 4, in preparing step S1, first insulating layer 10 is prepared. A copper foil 31 and a copper foil 24 are disposed on first main surface 10a and on second main surface 10b of first insulating layer 10 prepared in preparing step S1, respectively. Copper foil 31 will form second ground pattern 30.

Figure 5:
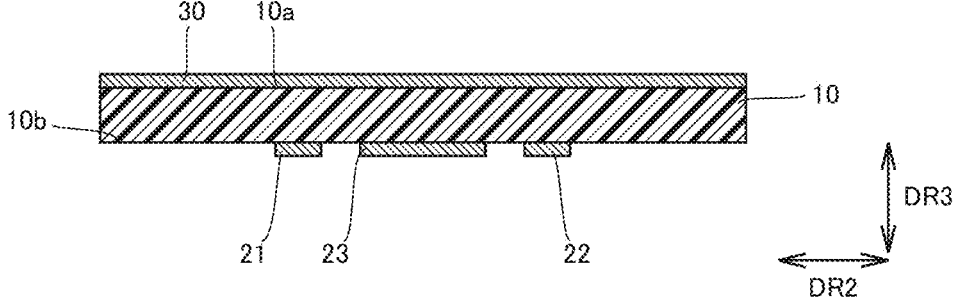
FIG. 5 is a cross-sectional view illustrating a patterning step S2.

FIG. 5 is a cross-sectional view illustrating patterning step S2. As shown in FIG. 5, in patterning step S2, copper foil 24 is patterned, and first wire pattern 21, second wire pattern 22 and first ground pattern 23 are thereby formed.

In patterning of copper foil 24, a dry film resist is first attached onto copper foil 24. Secondly, the attached dry film resist is developed and exposed. Thirdly, copper foil 24 is etched using the developed and exposed dry film resist as a mask, and first wire pattern 21, second wire pattern 22 and first ground pattern 23 are thereby formed.

Figure 6:
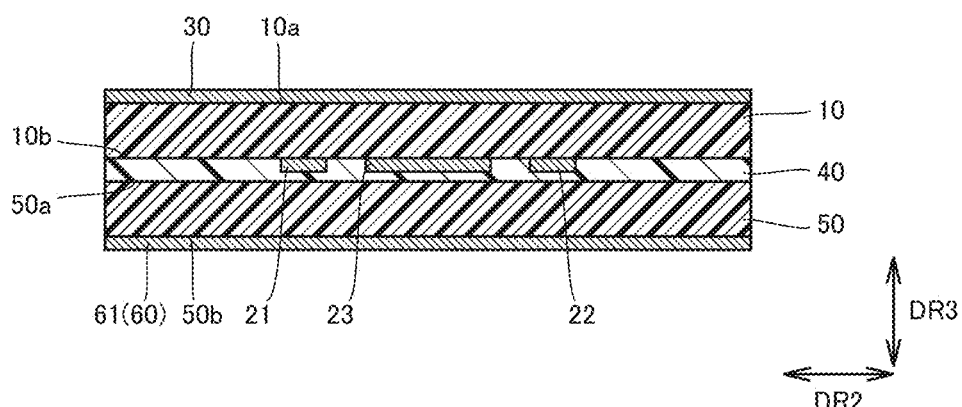
FIG. 6 is a cross-sectional view illustrating a bonding step S3.

FIG. 6 is a cross-sectional view illustrating bonding step S3. As shown in FIG. 6, in bonding step S3, second insulating layer 50 having a copper foil 61 disposed on fourth main surface 50b is attached to first insulating layer 10 using adhesive layer 40. Copper foil 61 will form third ground pattern 60.

Figure 7:
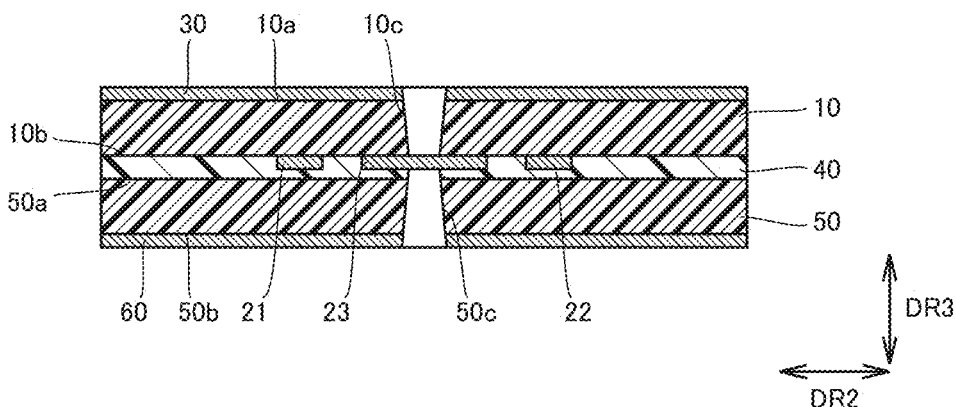
FIG. 7 is a cross-sectional view illustrating a through-hole forming step S4.

FIG. 7 is a cross-sectional view illustrating through-hole forming step S4. As shown in FIG. 7, in through-hole forming step S4, first through-hole 10c and second through-hole 50c are formed. First through-hole 10c and second through-hole 50c are formed by irradiation with a laser beam, for example.

In plating step S5, plating is performed to thereby form first conductor layer 70 on the inner wall surface of first through-hole 10c and on first ground pattern 23 exposed from first through-hole 10c, as well as second conductor layer 80 on the inner wall surface of second through-hole 50c and on first ground pattern 23 exposed from second through-hole 50c. The plating is performed by an electroless plating method or an electrolytic plating method. As described above, printed wiring board 100 having the structure shown in FIGS. 1 and 2 is manufactured.

<Effect of Printed Wiring Board 100>

The effect of printed wiring board 100 will be described in comparison with a printed wiring board according to a comparative example. The printed wiring board according to the comparative example will be referred to as a printed wiring board 200.

Figure 8:
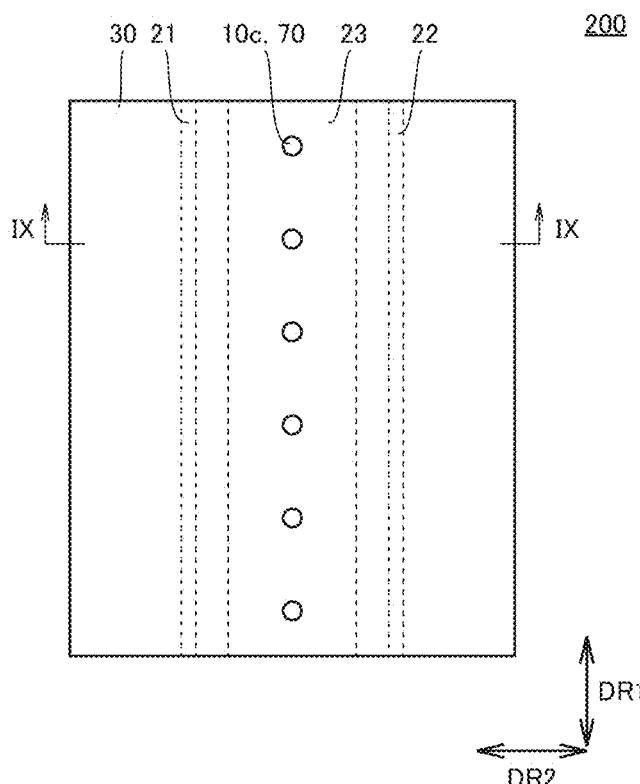
FIG. 8 is a plan view of a printed wiring board 200.
Figure 9:
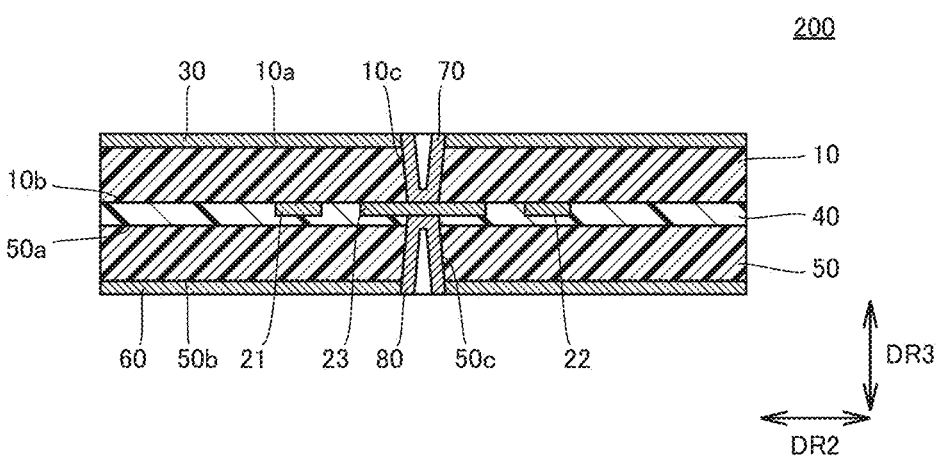
FIG. 9 is a cross-sectional view taken along IX-IX in FIG. 8.

FIG. 8 is a plan view of printed wiring board 200. FIG. 9 is a cross-sectional view taken along IX-IX in FIG. 8. As shown in FIGS. 8 and 9, printed wiring board 200 includes: first insulating layer 10; first wire pattern 21, second wire pattern 22 and first ground pattern 23; second ground pattern 30; adhesive layer 40; second insulating layer 50; third ground pattern 60; and first conductor layer 70 and second conductor layer 80.

In printed wiring board 200, first through-holes 10c and second through-holes 50c each have a circular shape in a plan view. In other words, in printed wiring board 200, the width of first through-hole 10c in second direction DR2 and the width of second through-hole 50c in second direction DR2 are equal to the width of first through-hole 10c in first direction DR1 and the width of second through-hole 50c in first direction DR1, respectively.

When a signal is transmitted through first wire pattern 21 and second wire pattern 22 (when a current flows through first wire pattern 21 and second wire pattern 22), electromagnetic waves are emitted from first wire pattern 21 and second wire pattern 22.

The electromagnetic wave emitted from first wire pattern 21 causes noise to the signal transmitted through second wire pattern 22, and the electromagnetic wave emitted from second wire pattern 22 causes noise to the signal transmitted through first wire pattern 21. In other words, crosstalk occurs between first wire pattern 21 and second wire pattern 22.

First conductor layer 70 electrically connects first ground pattern 23 and second ground pattern 30 to each other. Second conductor layer 80 electrically connects first ground pattern 23 and third ground pattern 60 to each other. Therefore, in printed wiring board 200, a part of the electromagnetic wave emitted from first wire pattern 21 toward second wire pattern 22 and a part of the electromagnetic wave emitted from second wire pattern 22 toward first wire pattern 21 are blocked by first conductor layer 70 and second conductor layer 80.

The electromagnetic wave may in some cases pass through the space between two first through-holes 10c adjacent to each other and the space between two second through-holes 50c adjacent to each other. In order to block the electromagnetic waves by first conductor layer 70 and second conductor layer 80, it is therefore effective to densely form first through-holes 10c and second through-holes 50c in first direction DR1.

In printed wiring board 200, first through-holes 10c and second through-holes 50c each have a circular shape in a plan view, and therefore, it is necessary to reduce the interval between first-through-holes 10c adjacent to each other and the interval between second through-holes 50c adjacent to each other, so as to densely form first through-holes 10c and second through-holes 50c in first direction DR1. The process accuracy for example of first through-holes 10c and second through-holes 50c limits the reduction of the interval between first through-holes 10c adjacent to each other.

As for printed wiring board 100, the width of first through-hole 10c in first direction DR1 and the width of second through-hole 50c in first direction DR1 are larger than the width of first through-hole 10c in second direction DR2 and the width of second through-hole 50c in second direction DR2, respectively, and therefore, first through-holes 10c and second through-holes 50c can be formed densely in first direction DR1, without reducing the interval between two first through-holes 10c adjacent to each other and the interval between two second through-holes 50c adjacent to each other. Thus, in printed wiring board 100, crosstalk between first wire pattern 21 and second wire pattern 22 is further suppressed, as compared with printed wiring board 200.

Second Embodiment

A printed wiring board according to a second embodiment will be described.

The printed wiring board according to the second embodiment will be referred to as a printed wiring board 100A. Here, differences from printed wiring board 100 will be mainly described, and redundant description will not be repeated.

<Configuration of Printed Wiring Board 100A>

A configuration of printed wiring board 100A will be described below.

Figure 10:
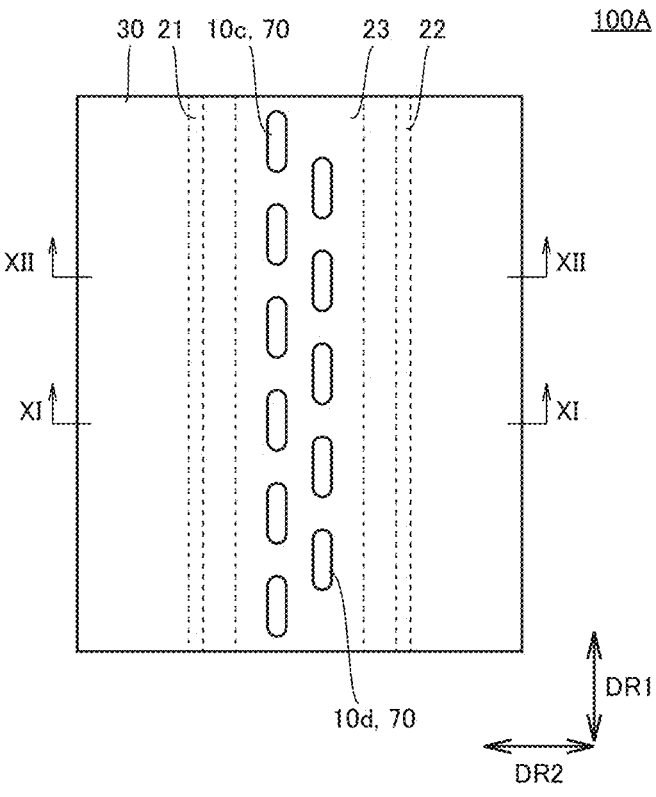
FIG. 10 is a plan view of a printed wiring board 100A.
Figure 11:
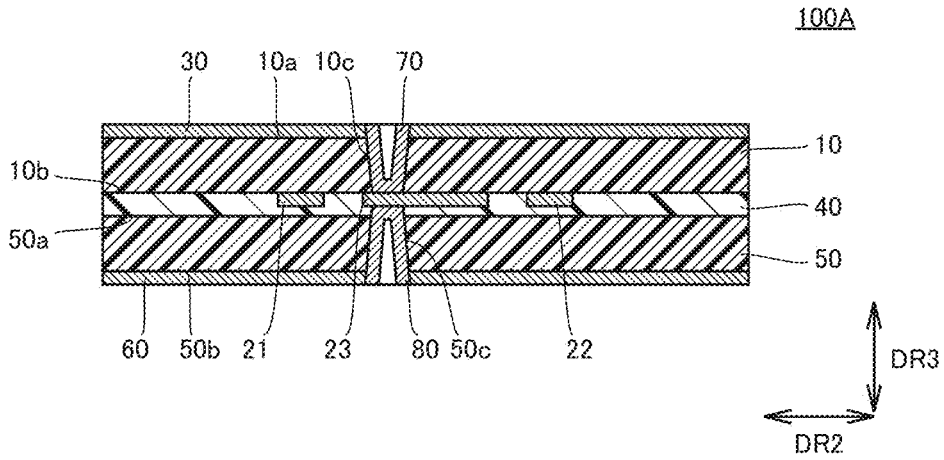
FIG. 11 is a cross-sectional view taken along XI-XI in FIG. 10.
Figure 12:
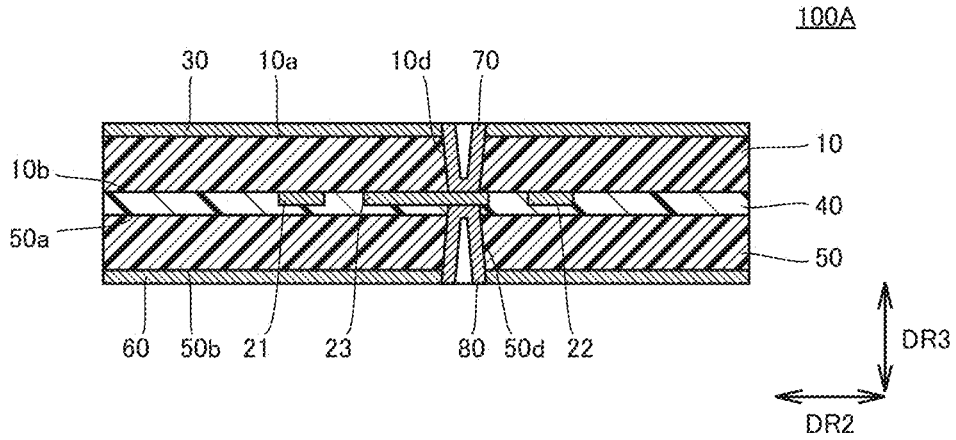
FIG. 12 is a cross-sectional view taken along XII-XII in FIG. 10.

FIG. 10 is a plan view of printed wiring board 100A. FIG. 11 is a cross-sectional view taken along XI-XI in FIG. 10. FIG. 12 is a cross-sectional view taken along XII-XII in FIG. 10. As shown in FIGS. 10, 11 and 12, printed wiring board 100A includes: first insulating layer 10; first wire pattern 21, second wire pattern 22 and first ground pattern 23; second ground pattern 30; adhesive layer 40; second insulating layer 50; third ground pattern 60; and first conductor layer 70 and second conductor layer 80. In this regard, the configuration of printed wiring board 100A is identical to the configuration of printed wiring board 100.

In printed wiring board 100A, a plurality of third through-holes 10d are formed in first insulating layer 10 and second ground pattern 30. Third through-holes 10d pass through first insulating layer 10 and second ground pattern 30 in thickness direction DR3. Third through-holes 10d overlap first ground pattern 23 in a plan view. Namely, first ground pattern 23 is exposed from third through-holes 10d.

The plurality of third through-holes 10d are spaced apart from each other and arranged to line up along first direction DR1. An interval between two third through-holes 10d adjacent to each other is constant, for example. The line of third through-holes 10d is disposed between the line of first through-holes 10c and second wire pattern 22 in a plan view.

The position of third through-hole 10d in first direction DR1 is displaced from the position of first through-hole 10c in first direction DR1.

The width of third through-hole 10d in first direction DR1 is larger than the width of third through-hole 10d in second direction DR2. Third through-hole 10d extends along first direction DR1, for example. Third through-hole 10d preferably has such an elliptical shape that a longitudinal direction is along first direction DR1 in a plan view.

In printed wiring board 100A, a plurality of fourth through-holes 50d are formed in adhesive layer 40, second insulating layer 50 and third ground pattern 60. Fourth through-holes 50d pass through adhesive layer 40, second insulating layer 50 and third ground pattern 60 in thickness direction DR3. Fourth through-holes 50d overlap first ground pattern 23 in a plan view. Namely, first ground pattern 23 is exposed from fourth through-holes 50d.

The plurality of fourth through-holes 50d are spaced apart from each other and arranged to line up along first direction DR1. An interval between two fourth through-holes 50d adjacent to each other is constant, for example. The line of fourth through-holes 50d is disposed between the line of second through-holes 50c and second wire pattern 22 in a plan view. The position of fourth through-hole 50d in first direction DR1 is displaced from the position of second through-hole 50c in first direction DR1.

The width of fourth through-hole 50d in first direction DR1 is larger than the width of fourth through-hole 50d in second direction DR2. Fourth through-hole 50d extends along first direction DR1, for example. Fourth through-hole 50d preferably has such an elliptical shape that a longitudinal direction is along first direction DR1 in a plan view.

The position of third through-hole 10d in first direction DR1 and the position of third through-hole 10d in second direction DR2 overlap the position of fourth through-hole 50d in first direction DR1 and the position of fourth through-hole 50d in second direction DR2, respectively.

In printed wiring board 100A, first conductor layer 70 is also disposed on an inner wall surface of each of third through-holes 10d. First conductor layer 70 may also be disposed on first ground pattern 23 exposed from third through-holes 10d. In printed wiring board 100A, second conductor layer 80 is also disposed on an inner wall surface of each of fourth through-holes 50d. Second conductor layer 80 may also be disposed on first ground pattern 23 disposed from fourth through-holes 50d.

First ground pattern 23 exposed from third through-holes 10d is electrically connected to second ground pattern 30 by first conductor layer 70. First ground pattern 23 exposed from fourth through-holes 50d is electrically connected to third ground pattern 60 by second conductor layer 80. In these respects, the configuration of printed wiring board 100A is different from the configuration of printed wiring board 100.

<Method for Manufacturing Printed Wiring Board 100A>

A method for manufacturing printed wiring board 100A will be described below.

The method for manufacturing printed wiring board 100A has preparing step S1, patterning step S2, bonding step S3, through-hole forming step S4, and plating step S5. In this regard, the method for manufacturing printed wiring board 100A is identical to the method for manufacturing printed wiring board 100.

In the method for manufacturing printed wiring board 100A, in through-hole forming step S4, third through-holes 10d and fourth through-holes 50d are also formed, in addition to first through-holes 10c and second through-holes 50c.

In the method for manufacturing printed wiring board 100A, in plating step S5, first conductor layer 70 is also formed on the inner wall surface of third through-holes 10d and on first ground pattern 23 exposed from third through-holes 10d. In the method for manufacturing printed wiring board 100A, in plating step S5, second conductor layer 80 is also formed on the inner wall surface of fourth through-holes 50d and on first ground pattern 23 exposed from fourth through-holes 50d. In these regards, the method for manufacturing printed wiring board 100A is different from the method for manufacturing printed wiring board 100.

<Effect of Printed Wiring Board 100A>

The effect of printed wiring board 100A will be described below.

In printed wiring board 100, the electromagnetic wave emitted from first wire pattern 21 and the electromagnetic wave emitted from second wire pattern 22 may in some cases pass through the space between two first through-holes 10c adjacent to each other and the space between two second through-holes 50c adjacent to each other.

In printed wiring board 100A, the position of third through-hole 10d in first direction DR1 is displaced from the position of first through-hole 10c in first direction DR1, and the position of fourth through-hole 50d in first direction DR1 is displaced from the position of second through-hole 50c in first direction DR1.

Therefore, in printed wiring board 100A, even when the electromagnetic wave emitted from first wire pattern 21 passes through the space between two first through-holes 10c adjacent to each other and the space between two second through-holes 50c adjacent to each other, the electromagnetic wave is blocked by first conductor layer 70 disposed on the inner wall surface of third through-holes 10d and second conductor layer 80 disposed on the inner wall surface of fourth through-holes 50d.

Likewise, in printed wiring board 100A, even when the electromagnetic wave emitted from second wire pattern 22 passes through the space between two third through-holes 10d adjacent to each other and the space between two fourth through-holes 50d adjacent to each other, the electromagnetic wave is blocked by first conductor layer 70 disposed on the inner wall surface of first through-holes 10c and second conductor layer 80 disposed on the inner wall surface of second through-holes 50c.

Therefore, according to printed wiring board 100A, crosstalk between first wire pattern 21 and second wire pattern 22 is further suppressed, as compared with printed wiring board 100.

Third Embodiment

A printed wiring board according to a third embodiment will be described. The printed wiring board according to the third embodiment will be referred to as a printed wiring board 100B. Here, differences from printed wiring board 100A will be mainly described, and redundant description will not be repeated.

<Configuration of Printed Wiring Board 100B>

A configuration of printed wiring board 100B will be described below.

Figure 13:
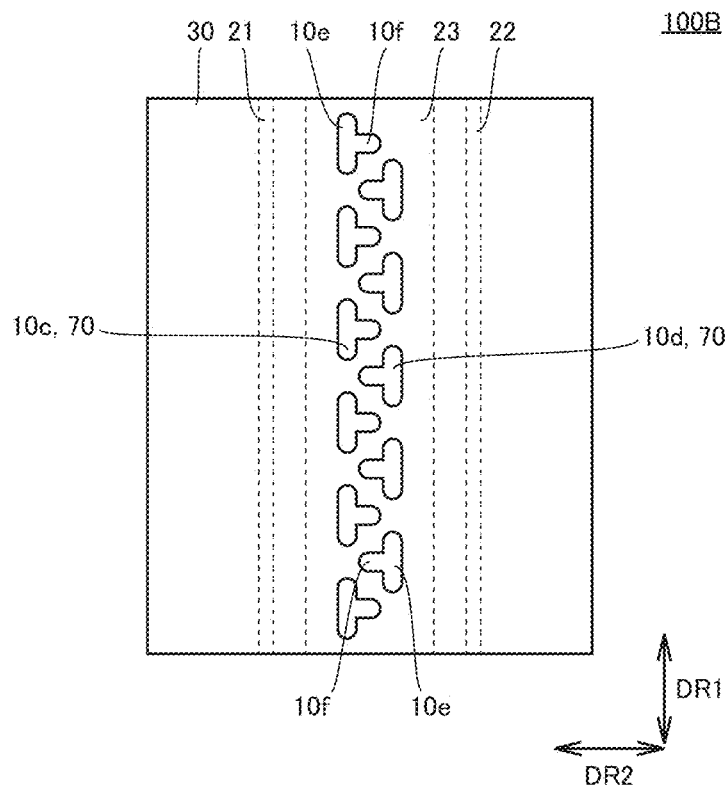
FIG. 13 is a plan view of a printed wiring board 100B.
Figure 14:
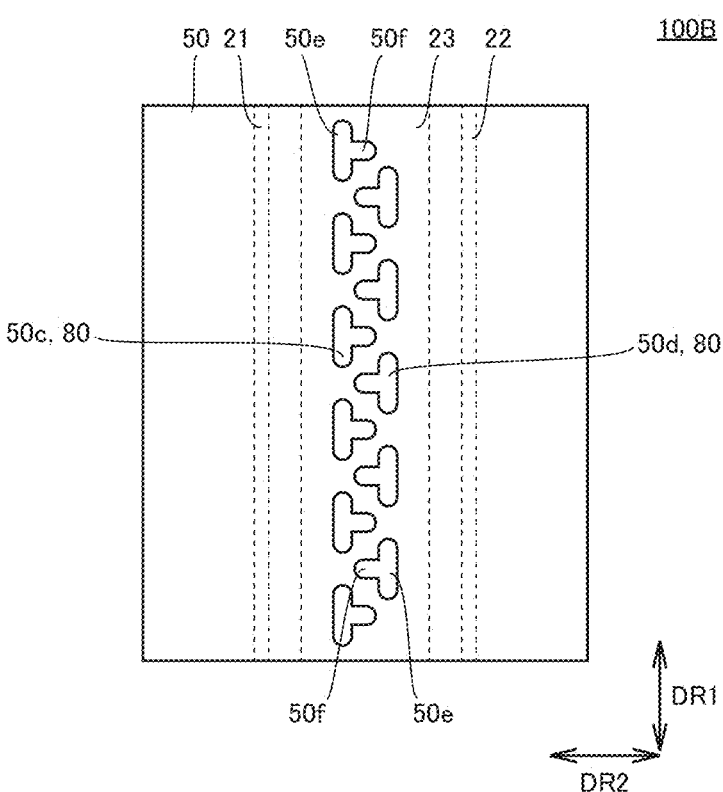
FIG. 14 is a bottom view of printed wiring board 100B.

FIG. 13 is a plan view of printed wiring board 100B. FIG. 14 is a bottom view of printed wiring board 100B. As shown in FIGS. 13 and 14, printed wiring board 100B includes: first insulating layer 10; first wire pattern 21, second wire pattern 22 and first ground pattern 23; second ground pattern 30; adhesive layer 40; second insulating layer 50; third ground pattern 60; and first conductor layer 70 and second conductor layer 80. In this regard, the configuration of printed wiring board 100B is identical to the configuration of printed wiring board 100A.

In printed wiring board 100B, first through-holes 10c and third through-holes 10d each include a first portion 10e and a second portion 10f, and second through-holes 50c and fourth through-holes 50d each include a first portion 50e and a second portion 50f. First portion 10e and first portion 50e each extend along first direction DR1. Second portion 10f and second portion 50f each extend along second direction DR2. Second portion 10f and second portion 50f are connected to a central portion of first portion 10e in first direction DR1 and a central portion of first portion 50e in first direction DR1, respectively.

In each of first through-holes 10c, second portion 10f extends from first portion 10e along a direction from first wire pattern 21 toward second wire pattern 22. In each of third through-holes 10d, second portion 10f extends from first portion 10e along a direction from second wire pattern 22 toward first wire pattern 21.

In each of second through-holes 50c, second portion 50f extends from first portion 50e along the direction from first wire pattern 21 toward second wire pattern 22. In each of fourth through-holes 50d, second portion 50f extends from first portion 50e along the direction from second wire pattern 22 toward first wire pattern 21. In these regards, the configuration of printed wiring board 100B is different from the configuration of printed wiring board 100A.

<Method for Manufacturing Printed Wiring Board 100B>

A method for manufacturing printed wiring board 100B will be described below.

The method for manufacturing printed wiring board 100B has preparing step S1, patterning step S2, bonding step S3, through-hole forming step S4, and plating step S5. In this regard, the method for manufacturing printed wiring board 100B is identical to the method for manufacturing printed wiring board 100A.

The method for manufacturing printed wiring board 100B is different from the method for manufacturing printed wiring board 100A in terms of the shape of each of first through-holes 10c, second through-holes 50c, third through-holes 10d, and fourth through-holes 50d formed in through-hole forming step S4.

<Effect of Printed Wiring Board 100B>

The effect of printed wiring board 100B will be described below.

In printed wiring board 100A, the electromagnetic wave emitted from first wire pattern 21 and the electromagnetic wave emitted from second wire pattern 22 may in some cases pass through the space between two first through-holes 10c adjacent to each other and the space between two second through-holes 50c adjacent to each other, as well as the space between two third through-holes 10d adjacent to each other and the space between two fourth through-holes 50d adjacent to each other, along a direction inclined with respect to second direction DR2.

In printed wiring board 100B, each of third through-holes 10d has second portion 10f and each of fourth through-holes 50d has second portion 50f, and therefore, the electromagnetic wave emitted from first wire pattern 21 is easily blocked by first conductor layer 70 located on the inner wall surface of second portion 10f of third through-hole 10d, and second conductor layer 80 located on the inner wall surface of second portion 50f of fourth through-hole 50d, even if the electromagnetic wave passes through the space between two first through-holes 10c adjacent to each other and the space between second through-holes 50c adjacent to each other.

Likewise, in printed wiring board 100B, each of first through-holes 10$c$ has second portion 10$f$ and each of second through-holes 50$c$ has second portion 50$f$, and therefore, the electromagnetic wave emitted from second wire pattern 22 is easily blocked by first conductor layer 70 located on the inner wall surface of second portion 10$f$ of first through-hole 10$c$ and second conductor layer 80 located on the inner wall surface of second portion 50$f$ of second through-hole 50$c$, even if the electromagnetic wave passes through the space between two third through-holes 10$d$ adjacent to each other and the space between fourth through-holes 50$d$ adjacent to each other.

As described above, according to printed wiring board 100B, crosstalk between first wire pattern 21 and second wire pattern 22 is further suppressed, as compared with printed wiring board 100A.

Fourth Embodiment

A printed wiring board according to a fourth embodiment will be described. The printed wiring board according to the fourth embodiment will be referred to as a printed wiring board 100C. Here, differences from printed wiring board 100A will be mainly described, and redundant description will not be repeated.

<Configuration of Printed Wiring Board 100C>

A configuration of printed wiring board 100C will be described below.

Figure 15:
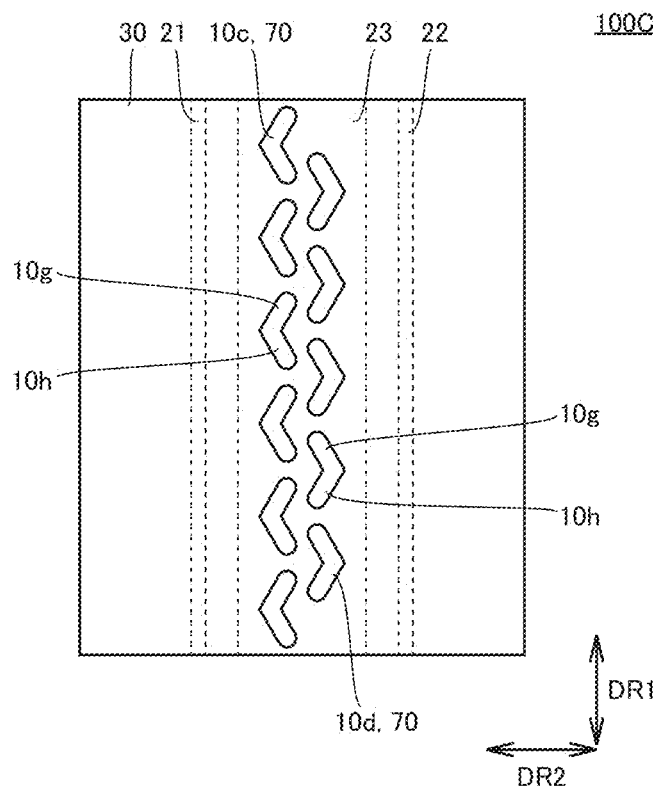
FIG. 15 is a plan view of a printed wiring board 100C.
Figure 16:
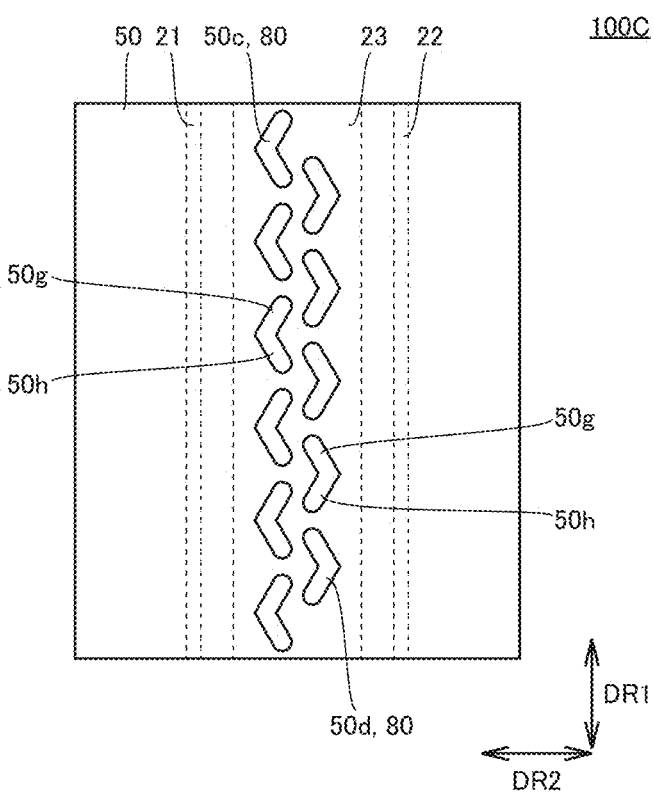
FIG. 16 is a bottom view of printed wiring board 100C.

FIG. 15 is a plan view of printed wiring board 100C. FIG. 16 is a bottom view of printed wiring board 100C. As shown in FIGS. 15 and 16, printed wiring board 100C includes: first insulating layer 10; first wire pattern 21, second wire pattern 22 and first ground pattern 23; second ground pattern 30; adhesive layer 40; second insulating layer 50; third ground pattern 60; and first conductor layer 70 and second conductor layer 80. In this regard, the configuration of printed wiring board 100C is identical to the configuration of printed wiring board 100A.

In printed wiring board 100C, first through-holes 10$c$ and third through-holes 10$d$ each include a third portion 10$g$ and a fourth portion 10$h$ extending linearly in a plan view. In printed wiring board 100C, second through-holes 50$c$ and fourth through-holes 50$d$ each include a third portion 50$g$ and a fourth portion 50$h$ extending linearly in a plan view.

One end of third portion 10$g$ and one end of fourth portion 10$h$ are connected to each other. The one end of third portion 10$g$ is located on one side in first direction DR1, relative to the other end of third portion 10$g$. The one end of fourth portion 10$h$ is located on the other side in first direction DR1, relative to the other end of fourth portion 10$h$.

One end of third portion 50$g$ and one end of fourth portion 50$h$ are connected to each other. The one end of third portion 50$g$ is located on one side in first direction DR1, relative to the other end of third portion 50$g$. The one end of fourth portion 50$h$ is located on the other side in first direction DR1, relative to the other end of fourth portion 50$h$.

In each of first through-holes 10$c$, the other end of third portion 10$g$ and the other end of fourth portion 10$h$ are located closer to second wire pattern 22, relative to the one end of third portion 10$g$ and the one end of fourth portion 10$h$, respectively. In each of third through-holes 10$d$, the other end of third portion 10$g$ and the other end of fourth portion 10$h$ are located closer to first wire pattern 21, relative to the one end of third portion 10$g$ and the one end of fourth portion 10$h$, respectively. In other words, each of first through-holes 10$c$ and each of third through-holes 10$d$ have an L shape in a plan view.

In each of second through-holes 50$c$, the other end of third portion 50$g$ and the other end of fourth portion 50$h$ are located closer to second wire pattern 22, relative to the one end of third portion 50$g$ and the one end of fourth portion 50$h$, respectively. In each of fourth through-holes 50$d$, the other end of third portion 50$g$ and the other end of fourth portion 50$h$ are located closer to first wire pattern 21, relative to the one end of third portion 50$g$ and the one end of fourth portion 50$h$, respectively. In other words, each of second through-holes 50$c$ and each of fourth through-holes 50$d$ have an L shape in a plan view. In these regards, the configuration of printed wiring board 100C is different from the configuration of printed wiring board 100A.

<Method for Manufacturing Printed Wiring Board 100C>

A method for manufacturing printed wiring board 100C will be described below.

The method for manufacturing printed wiring board 100C has preparing step S1, patterning step S2, bonding step S3, through-hole forming step S4, and plating step S5. In this regard, the method for manufacturing printed wiring board 100C is identical to the method for manufacturing printed wiring board 100A.

The method for manufacturing printed wiring board 100C is different from the method for manufacturing printed wiring board 100A in terms of the shape of each of first through-holes 10$c$, second through-holes 50$c$, third through-holes 10$d$, and fourth through-holes 50$d$ formed in through-hole forming step S4.

<Effect of Printed Wiring Board 100C>

The effect of printed wiring board 100C will be described below.

In printed wiring board 100A, the electromagnetic wave emitted from first wire pattern 21 and the electromagnetic wave emitted from second wire pattern 22 may in some cases pass through the space between two first through-holes 10$c$ adjacent to each other and the space between two second through-holes 50$c$ adjacent to each other, as well as the space between two third through-holes 10$d$ adjacent to each other and the space between two fourth through-holes 50$d$ adjacent to each other, along a direction inclined with respect to second direction DR2.

In printed wiring board 100C, third through-holes 10$d$ each include third portion 10$g$ and fourth portion 10$h$ and fourth through-holes 50$d$ each include third portion 50$g$ and fourth portion 50$h$, and therefore, the electromagnetic wave emitted from first wire pattern 21 is easily blocked by first conductor layer 70 on the inner wall surface of third through-holes 10$d$ and second conductor layer 80 on the inner wall surface of fourth through-holes 50$d$, even if the electromagnetic wave passes through the space between two first through-holes 10$c$ adjacent to each other and the space between second through-holes 50$c$ adjacent to each other.

Likewise, in printed wiring board 100C, first through-holes 10$c$ each include third portion 10$g$ and fourth portion 10$h$ and second through-holes 50$c$ each include third portion 50$g$ and fourth portion 50$h$, and therefore, the electromagnetic wave emitted from second wire pattern 22 is easily blocked by first conductor layer 70 on the inner wall surface of first through-holes 10$c$ and second conductor layer 80 on the inner wall surface of second through-holes 50$c$, even if the electromagnetic wave passes through the space between two third through-holes 10$d$ adjacent to each other and the space between fourth through-holes 50$d$ adjacent to each other.

As described above, according to printed wiring board 100C, crosstalk between first wire pattern 21 and second wire pattern 22 is further suppressed, as compared with printed wiring board 100A.

Fifth Embodiment

A printed wiring board according to a fifth embodiment will be described. The printed wiring board according to the fifth embodiment will be referred to as a printed wiring board 100D. Here, differences from printed wiring board 100 will be mainly described, and redundant description will not be repeated.

<Configuration of Printed Wiring Board 100D>

A configuration of printed wiring board 100D will be described below.

Figure 17:
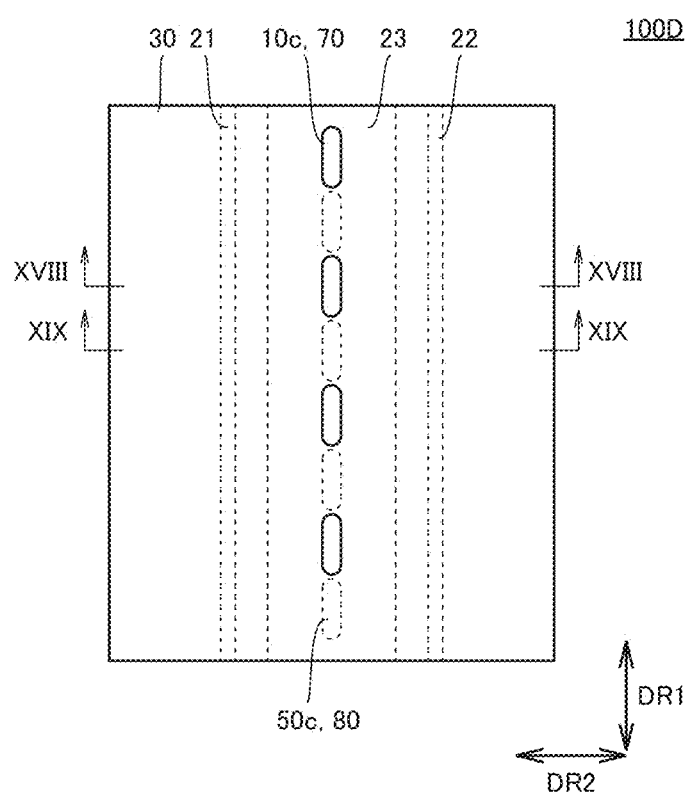
FIG. 17 is a plan view of a printed wiring board 100D.
Figure 18:
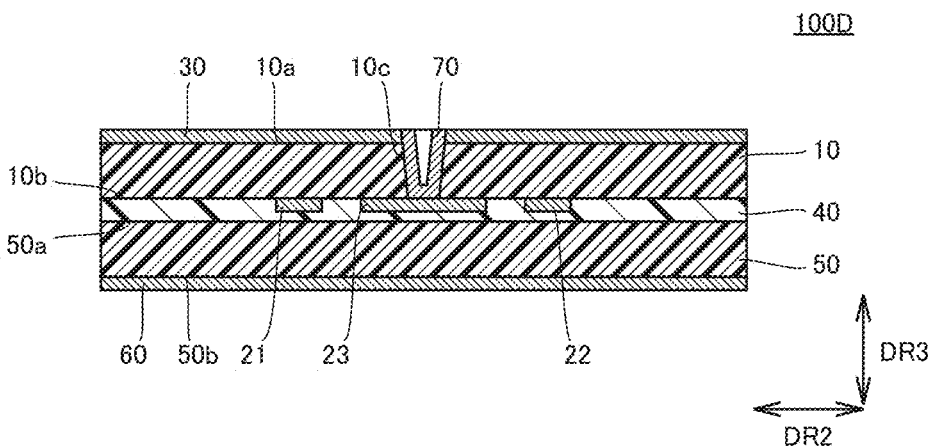
FIG. 18 is a cross-sectional view taken along XVIII-XVIII in FIG. 17.
Figure 19:
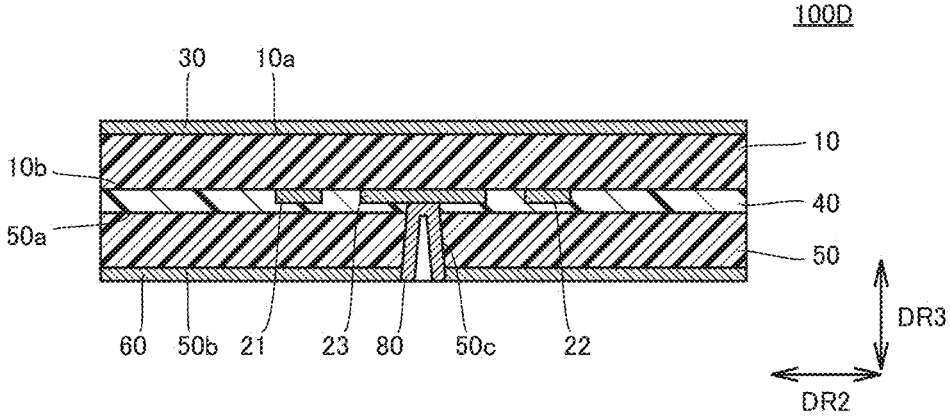
FIG. 19 is a cross-sectional view taken along XIX-XIX in FIG. 17.

FIG. 17 is a plan view of printed wiring board 100D. FIG. 18 is a cross-sectional view taken along XVIII-XVIII in FIG. 17. FIG. 19 is a cross-sectional view taken along XIX-XIX in FIG. 17. As shown in FIGS. 17, 18 and 19, printed wiring board 100D includes: first insulating layer 10; first wire pattern 21, second wire pattern 22 and first ground pattern 23; second ground pattern 30; adhesive layer 40; second insulating layer 50; third ground pattern 60; and first conductor layer 70 and second conductor layer 80. In this regard, the configuration of printed wiring board 100D is identical to the configuration of printed wiring board 100. In printed wiring board 100D, first through-hole 10c is located between two second through-holes 50c adjacent to each other in first direction DR1. In this regard, the configuration of printed wiring board 100D is different from the configuration of printed wiring board 100.

<Method for Manufacturing Printed Wiring Board 100D>

A method for manufacturing printed wiring board 100D will be described below.

The method for manufacturing printed wiring board 100D has preparing step S1, patterning step S2, bonding step S3, through-hole forming step S4, and plating step S5. In this regard, the method for manufacturing printed wiring board 100D is identical to the method for manufacturing printed wiring board 100. The method for manufacturing printed wiring board 100D is different from the method for manufacturing printed wiring board 100 in terms of the position of second through-holes 50c formed in through-hole forming step S4.

<Effect of Printed Wiring Board 100D>

The effect of printed wiring board 100D will be described below.

In printed wiring board 100, first ground pattern 23 is exposed from both first through-holes 10c and second through-holes 50c. Therefore, in printed wiring board 100, first ground pattern 23 may be damaged.

In contrast, in printed wiring board 100D, first ground pattern 23 is exposed from either first through-holes 10c only, or second through-holes 50c only. From another viewpoint, in printed wiring board 100D, first ground pattern 23 exposed from first through-holes 10c is supported by adhesive layer 40, second insulating layer 50 and third ground pattern 60, while first ground pattern 23 exposed from second through-holes 50c is supported by first insulating layer 10 and second ground pattern 30. Therefore, in printed wiring board 100D, damage to first ground pattern 23 can further be suppressed, as compared with printed wiring board 100.

Modification

Figure 20:
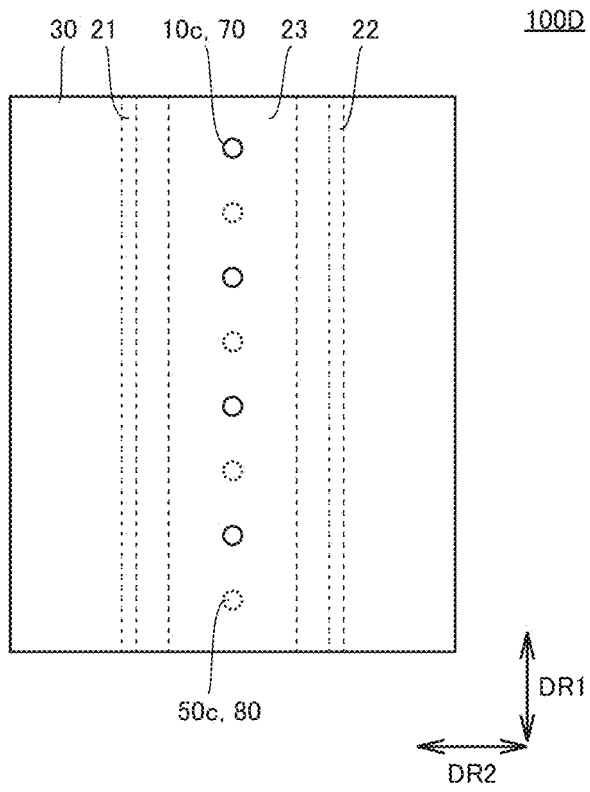
FIG. 20 is a plan view of a printed wiring board 100D according to a modification.

FIG. 20 is a plan view of a printed wiring board 100D according to a modification. As shown in FIG. 20, first through-holes 10c and second through-holes 50c in printed wiring board 100D are each circular in a plan view. Namely, in printed wiring board 100D, the width of first through-hole 10c in first direction DR1 may be equal to the width of first through-hole 10c in second direction DR2, and the width of second through-hole 50c in first direction DR1 may be equal to the width of second through-hole 50c in second direction DR2.

Sixth Embodiment

A printed wiring board according to a sixth embodiment will be described. The printed wiring board according to the sixth embodiment will be referred to as a printed wiring board 100E. Here, differences from printed wiring board 100A will be mainly described, and redundant description will not be repeated.

<Configuration of Printed Wiring Board 100E>

A configuration of printed wiring board 100E will be described below.

Figure 21:
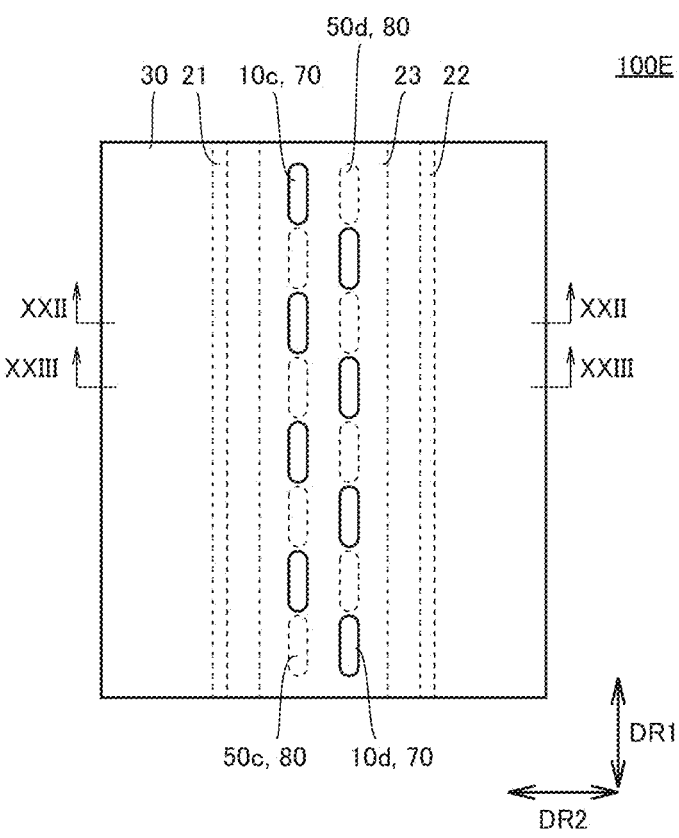
FIG. 21 is a plan view of a printed wiring board 100E.
Figure 22:
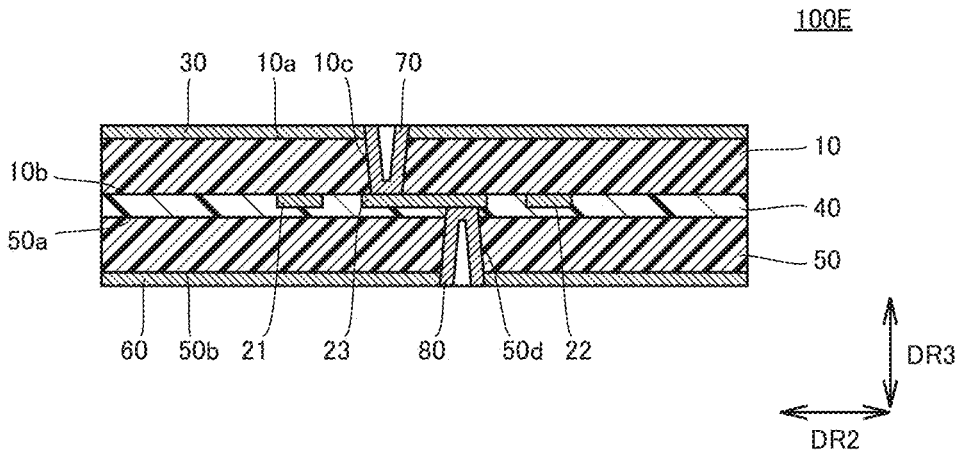
FIG. 22 is a cross-sectional view taken along XXII-XXII in FIG. 21.
Figure 23:
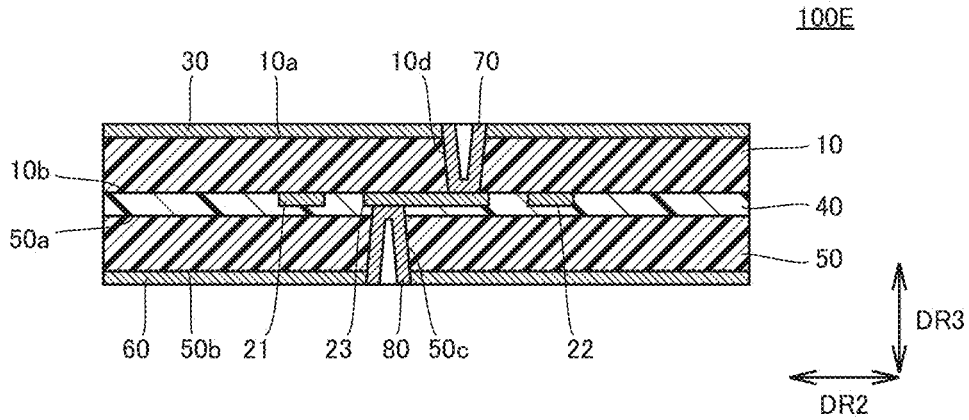
FIG. 23 is a cross-sectional view taken along XXIII-XXIII in FIG. 21.

FIG. 21 is a plan view of printed wiring board 100E. FIG. 22 is a cross-sectional view taken along XXII-XXII in FIG. 21. FIG. 23 is a cross-sectional view taken along XXIII-XXIII in FIG. 21. As shown in FIGS. 21, 22 and 23, printed wiring board 100E includes: first insulating layer 10; first wire pattern 21, second wire pattern 22 and first ground pattern 23; second ground pattern 30; adhesive layer 40; second insulating layer 50; third ground pattern 60; and first conductor layer 70 and second conductor layer 80. In this regard, the configuration of printed wiring board 100E is identical to the configuration of printed wiring board 100A.

In printed wiring board 100E, first through-hole 10c is located between two second through-holes 50c adjacent to each other in first direction DR1, and third through-hole 10d is located between two fourth through-holes 50d adjacent to each other in first direction DR1. In this regard, the configuration of printed wiring board 100E is different from the configuration of printed wiring board 100A.

<Method for Manufacturing Printed Wiring Board 100E>

A method for manufacturing printed wiring board 100E will be described below.

The method for manufacturing printed wiring board 100E has preparing step S1, patterning step S2, bonding step S3, through-hole forming step S4, and plating step S5. In this regard, the method for manufacturing printed wiring board 100E is identical to the method for manufacturing printed wiring board 100A. In the method for manufacturing printed wiring board 100E, respective positions of second through-holes 50c and fourth through-holes 50d formed in through-hole forming step S4 are different from those in the method for manufacturing printed wiring board 100A.

<Effect of Printed Wiring Board 100E>

The effect of printed wiring board 100E will be described below.

In printed wiring board 100A, first ground pattern 23 is exposed from both first through-holes 10c and second through-holes 50c, and exposed from both third through-holes 10d and fourth through-holes 50d. Therefore, in printed wiring board 100A, first ground pattern 23 may be damaged.

In contrast, in printed wiring board 100E, first ground pattern 23 is exposed from either first through-holes 10c or second through-holes 50c only, or exposed from either third through-holes 10d or fourth through-holes 50d only.

From another viewpoint, in printed wiring board 100E, first ground pattern 23 exposed from first through-holes 10c or third through-holes 10d is supported by adhesive layer 40, second insulating layer 50 and third ground pattern 60, while first ground pattern 23 exposed from second through-holes 50c or fourth through-holes 50d is supported by first insulating layer 10 and second ground pattern 30. Therefore, in printed wiring board 100E damage to first ground pattern 23 can further be suppressed, as compared with printed wiring board 100A.

Seventh Embodiment

A printed wiring board according to a seventh embodiment will be described. The printed wiring board according to the seventh embodiment will be referred to as a printed wiring board 100F. Here, differences from printed wiring board 100A will be mainly described, and redundant description will not be repeated.
<Configuration of Printed Wiring Board 100F>
A configuration of printed wiring board 100F will be described below.

Figure 24:
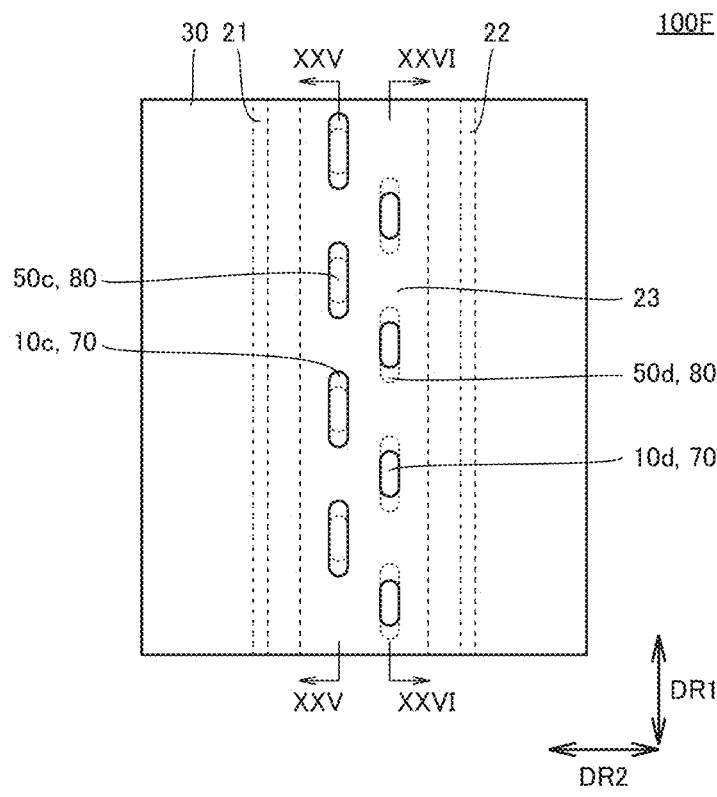
FIG. 24 is a plan view of a printed wiring board 100F.
Figure 25:
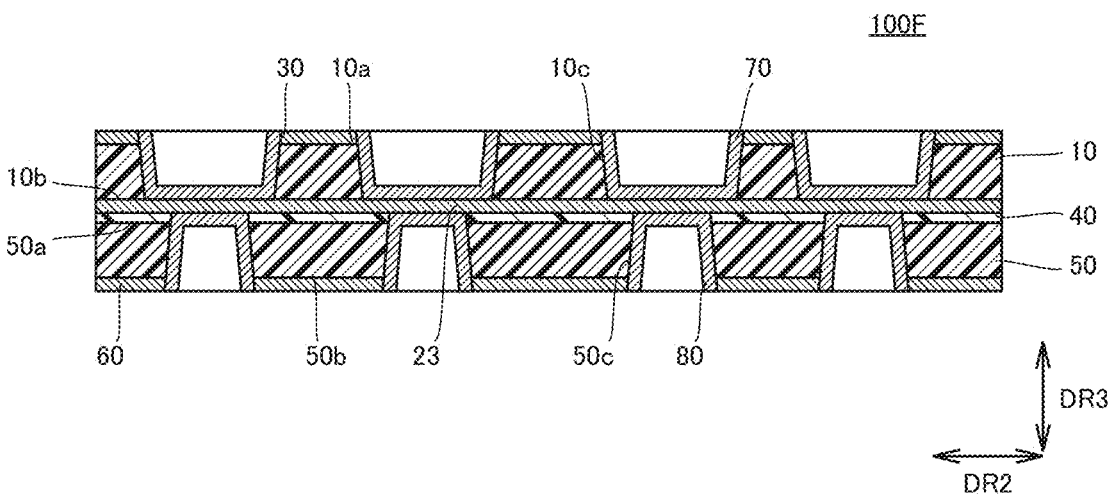
FIG. 25 is a cross-sectional view taken along XXV-XXV in FIG. 24.
Figure 26:
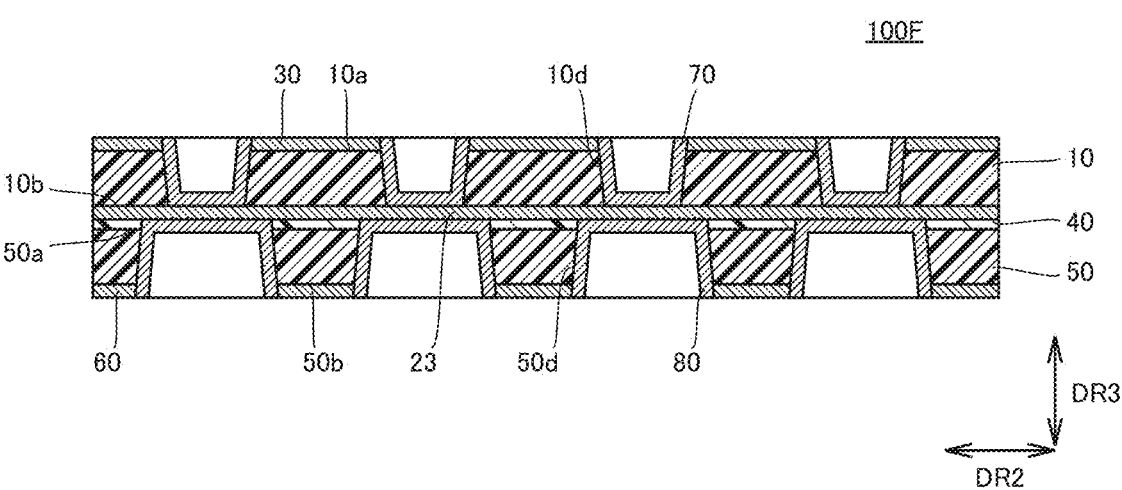
FIG. 26 is a cross-sectional view taken along XXVI-XXVI in FIG. 24.

FIG. 24 is a plan view of printed wiring board 100F. FIG. 25 is a cross-sectional view taken along XXV-XXV in FIG. 24. FIG. 26 is a cross-sectional view taken along XXVI-XXVI in FIG. 24. As shown in FIGS. 24, 25 and 26, printed wiring board 100F includes: first insulating layer 10; first wire pattern 21, second wire pattern 22 and first ground pattern 23; second ground pattern 30; adhesive layer 40; second insulating layer 50; third ground pattern 60; and first conductor layer 70 and second conductor layer 80. In this regard, the configuration of printed wiring board 100F is identical to the configuration of printed wiring board 100A.

In printed wiring board 100F, the width of first through-hole 10c in first direction DR1 is different from the width of second through-hole 50c in first direction DR1. More specifically, the width of first through-hole 10c in first direction DR1 is larger than the width of second through-hole 50c in first direction DR1.

Further, in printed wiring board 100F, the width of third through-hole 10d in first direction DR1 is different from the width of fourth through-hole 50d in first direction DR1. More specifically, the width of fourth through-hole 50d in first direction DR1 is larger than the width of third through-hole 10d in first direction DR1. In these regards, the configuration of printed wiring board 100F is different from the configuration of printed wiring board 100A.
<Method for Manufacturing Printed Wiring Board 100F>
A method for manufacturing printed wiring board 100F will be described below.

The method for manufacturing printed wiring board 100F has preparing step S1, patterning step S2, bonding step S3, through-hole forming step S4, and plating step S5. In this regard, the method for manufacturing printed wiring board 100F is identical to the method for manufacturing printed wiring board 100A. In the method for manufacturing printed wiring board 100F, respective positions of second through-holes 50c and fourth through-holes 50d formed in through-hole forming step S4 are different from those in the method for manufacturing printed wiring board 100A.
<Effect of Printed Wiring Board 100F>
The effect of printed wiring board 100F will be described below.

In printed wiring board 100A, first ground pattern 23 is exposed from both first through-holes 10c and second through-holes 50c, and exposed from both third through-holes 10d and fourth through-holes 50d. Therefore, in printed wiring board 100A, first ground pattern 23 may be damaged.

In printed wiring board 100F as well, first ground pattern 23 is exposed from both first through-holes 10c and second through-holes 50c, and exposed from both third through-holes 10d and fourth through-holes 50d. In printed wiring board 100F, however, the area of first ground pattern 23 exposed from second through-holes 50c is smaller and the area of first ground pattern 23 exposed from third through-holes 10d is smaller, as compared with printed wiring board 100A. Therefore, in printed wiring board 100F, damage to first ground pattern 23 can further be suppressed, as compared with printed wiring board 100A.

It should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

REFERENCE SIGNS LIST

10 first insulating layer; 10a first main surface; 10b second main surface; 10c first through-hole; 10d third through-hole; 10e first portion; 10f second portion; 10g third portion; 10h fourth portion; 21 first wire pattern; 22 second wire pattern; 23 first ground pattern; 24 copper foil; 30 second ground pattern; 31 copper foil; 40 adhesive layer; 50 second insulating layer; 50a third main surface; 50b fourth main surface; 50c second through-hole; 50d fourth through-hole; 50e first portion; 50f second portion; 50g third portion; 50h fourth portion; 60 third ground pattern; 61 copper foil; 70 first conductor layer; 80 second conductor layer; 100 printed wiring board; 100A, 100B, 100C, 100D, 100E, 100F, 200 printed wiring board; DR1 first direction; DR2 second direction; DR3 thickness direction; S1 preparing step; S2 patterning step; S3 bonding step; S4 through-hole forming step; S5 plating step.

The invention claimed is:

1. A printed wiring board comprising:
a first insulating layer having a first main surface and a second main surface opposite to the first main surface;
a first wire pattern, a second wire pattern, and a first ground pattern that are disposed on the second main surface and extend along a first direction in a plan view;
a second ground pattern disposed on the first main surface;
an adhesive layer disposed on the second main surface so as to cover the first wire pattern, the second wire pattern, and the first ground pattern;
a second insulating layer disposed on the adhesive layer and having a third main surface facing the adhesive layer and a fourth main surface opposite to the third main surface;
a third ground pattern disposed on the fourth main surface; and
a first conductor layer and a second conductor layer, wherein
in a second direction orthogonal to the first direction, the first ground pattern is located between the first wire pattern and the second wire pattern, and spaced apart from the first wire pattern and the second wire pattern,
in the first insulating layer and the second ground pattern, a plurality of first through-holes passing through the first insulating layer and the second ground pattern in a thickness direction orthogonal to the first direction and the second direction, and overlapping the first ground pattern in a plan view are formed, the plurality of first through-holes are spaced apart from each other and arranged to line up along the first direction, in the adhesive layer, the second insulating layer, and the third ground pattern, a plurality of second through-holes passing through the adhesive layer, the second insulating layer, and the third ground pattern in the thickness direction, and overlapping the first ground pattern in a plan view are formed, the plurality of second through-holes are spaced apart from each other and arranged to line up along the first direction, the first conductor layer is disposed on an inner wall surface of each of the plurality of first through-holes, and electrically connected to the first ground pattern and the second ground pattern, the second conductor layer is disposed on an inner wall surface of each of the plurality of second through-holes, and electrically connected to the first ground pattern and the third ground pattern, and each of the plurality of first through-holes and each of the plurality of second through-holes have a width in the first direction and a width in the second direction, and the width in the first direction is larger than the width in the second direction.

2. The printed wiring board according to claim 1, wherein each of the plurality of first through-holes and each of the plurality of second through-holes extend along the first direction in a plan view.

3. The printed wiring board according to claim 1, wherein in the first insulating layer and the second ground pattern, a plurality of third through-holes passing through the first insulating layer and the second ground pattern in the thickness direction and overlapping the first ground pattern in a plan view are further formed, the plurality of third through-holes are spaced apart from each other and arranged to line up along the first direction, between a line of the plurality of first through-holes and the second wire pattern, in the adhesive layer, the second insulating layer, and the third ground pattern, a plurality of fourth through-holes passing through the adhesive layer, the second insulating layer, and the third ground pattern in the thickness direction and overlapping the first ground pattern in a plan view are further formed, the plurality of fourth through-holes are spaced apart from each other and arranged to line up along the first direction, between a line of the plurality of second through-holes and the second wire pattern, a position of each of the plurality of third through-holes in the first direction is displaced from a position of each of the plurality of first through-holes in the first direction, a position of each of the plurality of fourth through-holes in the first direction is displaced from a position of each of the plurality of second through-holes in the first direction, the first conductor layer is further disposed on an inner wall surface of each of the plurality of third through-holes, and electrically connected to the first ground pattern and the second ground pattern, the second conductor layer is further disposed on an inner wall surface of each of the plurality of fourth through-holes, and electrically connected to the first ground pattern and the third ground pattern, and each of the plurality of third through-holes and each of the plurality of fourth through-holes have a width in the first direction and a width in the second direction, and the width in the first direction is larger than the width in the second direction.

4. The printed wiring board according to claim 3, wherein each of the plurality of first through-holes, each of the plurality of second through-holes, each of the plurality of third through-holes, and each of the plurality of fourth through-holes extend along the first direction in a plan view.

5. The printed wiring board according to claim 3, wherein each of the plurality of first through-holes, each of the plurality of second through-holes, each of the plurality of third through-holes, and each of the plurality of fourth through-holes include a first portion extending along the first direction and a second portion connected to a central portion of the first portion in the first direction, in a plan view, in each of the plurality of first through-holes and each of the plurality of second through-holes, the second portion extends from the first portion along a direction from the first wire pattern toward the second wire pattern, and in each of the plurality of third through-holes and each of the plurality of fourth through-holes, the second portion extends from the first portion along a direction from the second wire pattern toward the first wire pattern.

6. The printed wiring board according to claim 3, wherein each of the plurality of first through-holes, each of the plurality of second through-holes, each of the plurality of third through-holes, and each of the plurality of fourth through-holes include a third portion and a fourth portion each extending linearly in a plan view, one end of the third portion and one end of the fourth portion are connected to each other, the one end of the third portion is located on one side in the first direction, relative to the other end of the third portion, the one end of the fourth portion is located on the other side in the first direction, relative to the other end of the fourth portion, in each of the plurality of first through-holes and each of the plurality of second through-holes, the other end of the third portion and the other end of the fourth portion are located closer to the second wire pattern, relative to the one end of the third portion and the one end of the fourth portion, respectively, and in each of the plurality of third through-holes and each of the plurality of fourth through-holes, the other end of the third portion and the other end of the fourth portion are located closer to the first wire pattern, relative to the one end of the third portion and the one end of the fourth portion, respectively.

7. The printed wiring board according to claim 1, wherein each of the plurality of first through-holes and each of the plurality of second through-holes extend along the first direction in a plan view, a position of each of the plurality of first through-holes in the second direction overlaps a position of each of the plurality of second through-holes in the second direction, and each of the plurality of first through-holes is located between two second through-holes adjacent to each other in the first direction, among the plurality of second through-holes.

8. The printed wiring board according to claim 7, wherein in the first insulating layer and the second ground pattern, a plurality of third through-holes passing through the first insulating layer and the second ground pattern in the thickness direction and overlapping the first ground pattern in a plan view are further formed, the plurality of third through-holes are spaced apart from each other and arranged to line up along the first direction, between a line of the plurality of first through-holes and the second wire pattern, in the adhesive layer, the second insulating layer, and the third ground pattern, a plurality of fourth through-holes passing through the adhesive layer, the second insulating layer, and the third ground pattern in the thickness direction and overlapping the first ground pattern in a plan view are further formed, the plurality of fourth through-holes are spaced apart from each other and arranged to line up along the first direction, between a line of the plurality of second through-holes and the second wire pattern, each of the plurality of third through-holes and each of the plurality of fourth through-holes extend along the first direction in a plan view, a position of each of the plurality of third through-holes in the second direction overlaps a position of each of the plurality of fourth through-holes in the second direction, each of the plurality of third through-holes is located between two fourth through-holes adjacent to each other in the first direction, among the plurality of fourth through-holes, the first conductor layer is further disposed on an inner wall surface of each of the plurality of third through-holes, and electrically connected to the first ground pattern and the second ground pattern, and the second conductor layer is further disposed on an inner wall surface of each of the plurality of fourth through-holes, and electrically connected to the first ground pattern and the third ground pattern.

9. The printed wiring board according to claim 8, wherein a position of each of the plurality of third through-holes in the first direction is displaced from a position of each of the plurality of first through-holes in the first direction, and a position of each of the plurality of fourth through-holes in the first direction is displaced from a position of each of the plurality of second through-holes in the first direction.

10. The printed wiring board according to claim 1, wherein each of the plurality of first through-holes and each of the plurality of second through-holes extend along the first direction in a plan view, respective positions of the plurality of first through-holes overlap respective positions of the plurality of second through-holes, respectively, in the first direction and the second direction, and a length of each of the plurality of first through-holes in the first direction is larger than a length of each of the plurality of second through-holes in the first direction.

11. The printed wiring board according to claim 10, wherein in the first insulating layer and the second ground pattern, a plurality of third through-holes passing through the first insulating layer and the second ground pattern in the thickness direction and overlapping the first ground pattern in a plan view are further formed, the plurality of third through-holes are spaced apart from each other and arranged to line up along the first direction, between a line of the plurality of first through-holes and the second wire pattern, in the adhesive layer, the second insulating layer, and the third ground pattern, a plurality of fourth through-holes passing through the adhesive layer, the second insulating layer, and the third ground pattern in the thickness direction and overlapping the first ground pattern in a plan view are further formed, the plurality of fourth through-holes are spaced apart from each other and arranged to line up along the first direction, between a line of the plurality of second through-holes and the second wire pattern, each of the plurality of third through-holes and each of the plurality of fourth through-holes extend along the first direction in a plan view, respective positions of the plurality of third through-holes overlap respective positions of the plurality of fourth through-holes, respectively, in the first direction and the second direction, a length of each of the plurality of fourth through-holes in the first direction is larger than a length of each of the plurality of third through-holes in the first direction, the first conductor layer is further disposed on an inner wall surface of each of the plurality of third through-holes, and electrically connected to the first ground pattern and the second ground pattern, and the second conductor layer is further disposed on an inner wall surface of each of the plurality of fourth through-holes, and electrically connected to the first ground pattern and the third ground pattern.

* * * * *